US012745481B2

(12) United States Patent
Fischer et al.

(10) Patent No.: US 12,745,481 B2
(45) Date of Patent: Sep. 22, 2026

(54) APPARATUS AND METHOD FOR REFURBISHING BACK SIDES OF SOLAR MODULES

(71) Applicants: HoFi GmbH, Winnenden (DE); Josef Joachim Gmeiner, Pressath (DE)

(72) Inventors: Horst Fischer, Winnenden (DE); Josef Joachim Gmeiner, Pressath (DE)

(73) Assignees: HoFi GmbH, Winneden (DE); Josef Joachim Gmeiner, Pressath (DE)

( * ) Notice: Subject to any disclaimer, the term of this patent is extended or adjusted under 35 U.S.C. 154(b) by 760 days.

(21) Appl. No.: 18/005,477

(22) PCT Filed: Aug. 15, 2022

(86) PCT No.: PCT/IB2022/057610
§ 371 (c)(1),
(2) Date: Jan. 13, 2023

(87) PCT Pub. No.: WO2024/038297
PCT Pub. Date: Feb. 22, 2024

(65) Prior Publication Data
US 2024/0250200 A1 Jul. 25, 2024

(51) Int. Cl.
*H10F 19/80* (2025.01)
*H10F 19/85* (2025.01)
(Continued)

(52) U.S. Cl.
CPC ............. *H10F 71/00* (2025.01); *H10F 19/80* (2025.01); *H10F 19/85* (2025.01); *H10F 71/107* (2025.01); *H10F 71/137* (2025.01)

(58) Field of Classification Search
USPC .......................................................... 134/124
See application file for complete search history.

(56) References Cited

U.S. PATENT DOCUMENTS

2020/0313015 A1 10/2020 Harder et al.

FOREIGN PATENT DOCUMENTS

CN 114228089 A 3/2022
DE 19910405 C1 6/2000
(Continued)

OTHER PUBLICATIONS

Bohland J et al: "Photovoltaics as Hazardous Materials; the Recycling Solution", 2nd World Conference on Photovoltaic Solar Energy Conversion. / 15th European PV Solar Energy Conference. / 27th US IEEE Photovoltaics Specialists Conference. / IOTH Asia/ Pacific PV Science and Engineering Conference, Vienna, Austria, Jul. 6-10, 2019, Jul. 6, 1998.

*Primary Examiner* — Levon J Shahinian
(74) *Attorney, Agent, or Firm* — Laurence A. Greenberg; Werner H. Stemer; Ralph E. Locher

(57) ABSTRACT

An apparatus for refurbishing back sides of solar modules, has, successively in a direction of treatment, a washing device, a drying device, a solar module back side coating device, and a coating treatment device. There is also described a method for refurbishing back sides of solar modules, in which the solar modules are washed, are dried after washing, are coated on their backside in a coating process after drying, and the applied coating is dried and polymerized. The drying device is at least partially configured as a paternoster and/or the drying of the washed solar modules is carried out at least partially in a paternoster in which the lying solar modules are moved up and down while oriented horizontally.

27 Claims, 1 Drawing Sheet

(51) Int. Cl.

| | |
|---|---|
| ***H10F 71/00*** | (2025.01) |
| ***H10F 71/10*** | (2025.01) |

(56) References Cited

FOREIGN PATENT DOCUMENTS

| | | | |
|---|---|---|---|
| DE | 102017125226 | A1 | 5/2019 |
| DE | 102020002093 | A1 | 10/2021 |
| EP | 4040509 | A1 | 8/2022 |
| WO | 2019068929 | A1 | 4/2019 |

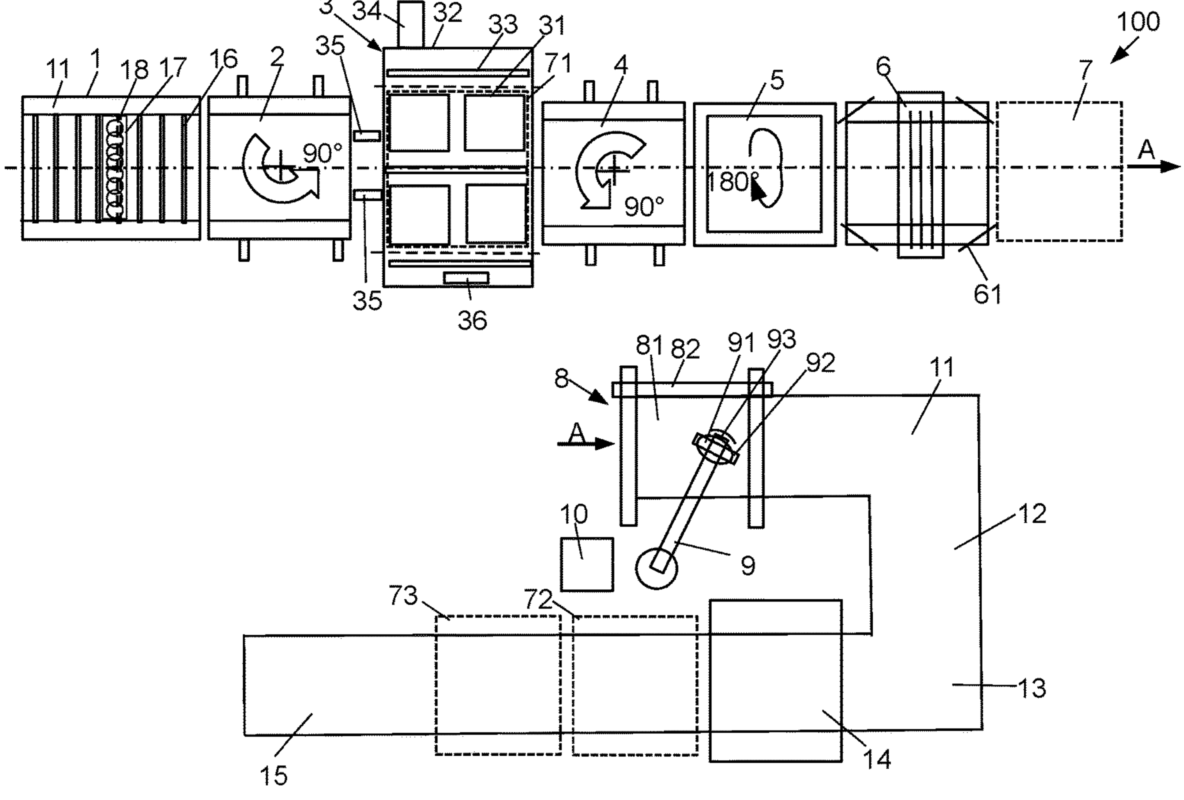
3
34
32
33
31
71
11
1
18
17
16
2
35
90°
4
90°
5
180°
6
7
100
A
35
36
61
8
81
82
91
93
92
11
A
10
9
12
73
72
13
15
14

APPARATUS AND METHOD FOR REFURBISHING BACK SIDES OF SOLAR MODULES

FIELD AND BACKGROUND OF THE INVENTION

The present invention relates to an apparatus for refurbishing back sides of solar modules, having, one after the other in a direction of treatment, a washing device, a drying device, a solar module back side coating device, and a coating treatment device. The invention further relates to a method for refurbishing back sides of solar modules, in which the solar modules are washed, are dried after washing, are coated on their back side in a coating process after drying, and the applied coating is dried and polymerized.

Photovoltaic systems consist of solar modules. Solar modules convert sunlight into electrical energy. Rigid solar modules typically consist of silicon-based solar cells, which are typically laminated in place, and which are hermetically encapsulated either between two glass plates or between a glass plate and a backing film using an embedding material.

Currently, solar modules in the form of glass/glass modules are used in particular by homeowners and in outdoor systems. These have a glass layer on the module top side, an embedding film for protecting the solar cells, solar cells, solder connections for connecting the solar cells, a backing film, a socket, and optionally an aluminum frame and a frame sealing tape for the stability and durability of the solar module.

Due to the use of the backing film instead of a glass plate, glass/film modules are less expensive and lighter than glass/glass modules. Since the backing film is used on the side of the solar module facing away from the light, which is exposed to fewer environmental influences, it is generally reasonable to use the less robust film on this side.

Films made of polyvinyl fluoride are usually used as backing films (also referred to as backsheet films). Films made of polyvinyl fluoride are highly tear resistant, UV resistant, and moreover form a moisture barrier. However, there are also backing films of solar modules made of polyamide or polyester (PET).

In particular in the case of backing films made of polyamide or polyester, damage—which, for example, is manifested in embrittlement, cracks, edge bondings destroyed by the incursion of water, delamination, yellowing, formation of bubbles and fractures—appears after a short period of use. This results in severe module damage and power losses of the photovoltaic systems, including the problem of lack of operational safety and the risk of fires.

A method for repairing a solar module is known from DE 10 2017 125 226 A1, in which the solar module is first cleaned and then an adhesive paste or liquid is applied to a partially or entirely damaged back side encapsulation element of the solar module, and a cover layer is applied on top of this, with the adhesive paste or liquid subsequently being cured.

DE 10 2020 002 093 A1 discloses a generic method for sealing the back side of such solar modules as part of a repair. The solar modules pass through several process steps. First, the solar modules are cleaned with water. The water remaining on the solar modules is subsequently wiped off, and then blown off using an air curtain. In order to also remove the residual water from the solar modules, they are then irradiated with pulsed infrared radiation. The back side of the solar modules cleaned and dried in this manner is then sprayed with a plastic sealing material, which is subsequently dried and polymerized by means of pulsed infrared light.

The solar modules treated in this manner are then fully operational again. However, it has been shown that, despite the intensive cleaning and drying steps and careful coating, inclusions can occur in the coating which can lead to detachment of the coating.

SUMMARY OF THE INVENTION

It is therefore the object of the present invention to improve the generic method in such a way that such detachment effects can be avoided. Furthermore, a suitable apparatus is to be provided, on which a corresponding method can be carried out with high efficiency.

The object is achieved, on the one hand, by an apparatus for refurbishing back sides of solar modules, having, successively in a direction of treatment, a washing device, a drying device, a solar module back side coating device, and a coating treatment device, wherein the drying device is formed at least partially as a paternoster.

In the paternoster, a plurality of solar modules that are in individual levels of the paternoster can be moved past at least one drying module of the drying device, with which an air and/or heat flow can be directed onto the solar modules, which flow dries both the front side and the back side of the solar modules. This is possible in the paternoster without the need to turn the solar modules.

The apparatus according to the invention works particularly effectively if the washing device has washing elements and washing nozzles arranged above and below a solar module conveyor track. The solar modules can be effectively cleaned from both sides simultaneously by the washing elements and washing nozzles arranged above and below the solar module conveyor track. The washing elements are, for example, roller-shaped brushes. The washing nozzles are preferably arranged in the form of at least one row of nozzles oriented transversely to the direction of treatment. The nozzles can be integrated in the washing elements. In this case, the washing elements and also the washing nozzles are designed and are operated with operating parameters (such as a brush rotational speed and/or water pressure) that make it possible to prevent further damage to the back sides of the solar modules.

It is particularly advantageous in this case if the washing device is a closed system with a closed water circuit.

The apparatus can have a reverse osmosis unit incorporated into the closed water circuit, which makes it particularly environmentally friendly.

Preferably, the solar modules are located in the paternoster on frame-like solar module supports, such that the entire surface area of the front and the back side of the solar modules can be dried at the same time.

The drying of the solar modules in the paternoster is particularly intensive if it is located in a paternoster cabinet, i.e., is surrounded by a housing which is heated or which can be heated. For this purpose, at least one heating element, such as a plurality of forced air heaters, for example, is arranged in and/or on the paternoster cabinet.

The drying in the drying device is further intensified if at least one air dehumidifier is arranged in the paternoster cabinet.

In order to be able to effectively carry out a rear-side coating of the cleaned and dried solar modules, it is advantageous if a solar module turning device is arranged between the drying device and the solar module back side coating device in the direction of treatment.

In an advantageous embodiment of the apparatus according to the invention, an infrared pretreatment device is arranged between the solar module turning device and the solar module back side coating device. The infrared pretreatment device is preferably used for the thorough drying of the back sides of the solar modules before the rear-side coating, but can also be used for preheating the back sides of the solar modules before the rear-side coating. Both have an advantageous effect on the adhesion and durability of the coating applied to the back sides of the solar modules during the rear-side coating.

It has been found that solar modules can have cracks in their backing film which are not able to be easily remediated with a simple spray coating. In an advantageous development of the apparatus according to the invention, the solar module back side coating device therefore has, in addition to a spraying or rolling device, an optical crack recognition device and a crack smoothing and/or filling device. If a crack is detected by the optical crack recognition device, which is for example a camera, it can be automatically filled with a filling compound by the crack smoothing and/or filling device. As such, all the cracks in the backing film can first be filled, and then the entire back side of the solar module can be sprayed by the spraying or rolling device with a plastic coating compound and/or the plastic coating can be rolled on. For this purpose, the solar module back side coating device is preferably mounted on a robot.

In order to achieve a high-quality rear-side coating with the spraying or rolling device of the solar module back side coating device, it is advantageous if a suction air curtain is formed on the sides of the solar module back side coating device.

In an advantageous embodiment of the present invention, the coating treatment device is also designed as a paternoster. This achieves particularly effective curing of the coating material applied to the back side of the solar module.

The coating treatment device is preferably an infrared coating treatment device. However, another heat and/or radiation treatment device, such as for example a UV radiation treatment device, can also be used for the coating treatment.

In principle, the coating treatment device can also be, or include, a cooling device. This may be advantageous, for example, if the coating that is applied to the solar modules is initially hot.

In an advantageous embodiment of the apparatus according to the invention, the drying device has a vacuum chamber, and/or a vacuum chamber is arranged after the coating treatment device in the direction of treatment. The formation of bubbles in the coating can be prevented in this way.

In a likewise advantageous embodiment of the invention, a solar module front-side nano-coating device is arranged after the coating treatment device in the direction of treatment. The solar module front side can thus also be protected.

The object is further achieved by a method for refurbishing back sides of solar modules, in which the solar modules are washed, are dried after washing, are coated on their back side in a coating process after drying, and the applied coating is dried and polymerized, wherein the drying of the washed solar modules is carried out at least partially in a paternoster in which the solar modules are moved up and down while horizontal.

By means of this approach, a large part of the water applied by the prior washing can be removed from the solar modules, so that the risk of water residues remaining in particular on the solar module back side leading to unwanted water drying spots, on which a subsequent coating does not adhere, or only insufficiently adheres, can be minimized. As a result of the upward and downward movement of the solar modules in the paternoster, essentially all locations on the front and the back side of the solar modules can be covered by the air and/or heat flow originating from the at least one drying module of the drying device, and thus effectively dried.

The method according to the invention can be carried out particularly effectively if the solar modules are simultaneously washed on both sides.

It is particularly advantageous if water used during washing of the solar modules is conveyed through a closed water circuit.

The method is particularly environmentally friendly if the water used for washing is cleaned in a reverse osmosis unit incorporated into the water circuit.

The drying effect of the paternoster can be further enhanced if the paternoster is in a paternoster cabinet that is heated.

The drying is further intensified if the paternoster cabinet is dehumidified.

In order to be able to coat the solar module back side easily, it is advantageous if the horizontal solar modules are turned after the drying and before the coating of the solar modules, with their back side pointing upward after the turning.

Particularly good adhesion and stability of the coating subsequently applied to the solar module back side is obtained if at least the back sides of the solar modules are heated and/or thoroughly dried by infrared irradiation after turning and before coating.

The quality of the refurbished solar modules can be significantly increased if, after the drying and before the coating of the solar modules, their back sides are examined for cracks with an optical crack recognition device.

If cracks are detected by the crack recognition device, which for example is a camera, it is useful not to merely provide these solar modules on the back side with a spray coating, but rather to fill up the cracks beforehand. Accordingly, in an advantageous embodiment of the method according to the invention, cracks detected by the crack recognition device are smoothed and/or filled by a crack smoothing and/or filling device.

The spray coating of the solar module back side is particularly homogeneous and without particle inclusions if, during the spray coating, air is suctioned off by means of an air suction curtain arranged on the side of a conveying device on which the solar modules lie during the spray coating.

Preferably, the coated solar modules are moved up and down on a paternoster while horizontal during the drying and the polymerization of the coating. This paternoster may be the same paternoster used to dry the washed solar modules, or may be a second paternoster. In such a paternoster, the curing of the coating composition takes place very effectively.

Preferably, the coating is dried and polymerized by infrared treatment, preferably by treatment with pulsed infrared radiation. However, the coated solar modules can also alternatively or additionally be treated with other radiation, for example with UV radiation and/or with heat, in order to dry and polymerize the coating.

If the coating applied to the solar modules is hot, the drying of the coating can also be achieved with cooling of the coating.

In an advantageous embodiment of the method according to the invention, the solar modules are dried and/or the coating is dried and/or polymerized in a vacuum. In this way, bubble formation in the coating can be prevented.

It is also advantageous if a nano-coating is applied to the solar module front side after the coating on the solar module back side has been dried and polymerized.

Before the washing or after the drying of the solar modules, an automatic incoming article inspection can be carried out.

Preferably, in the method according to the invention, the solar modules are automatically placed on and removed from an apparatus according to the invention.

It is particularly advantageous to use a coating material for the coating of the back sides of the solar modules which is hydrophilic and absorbs and includes water prior to drying and polymerizing. In this way, the water cannot lead to the formation of bubbles.

A preferred embodiment of the apparatus according to the invention and of the method according to the invention is explained in more detail below with reference to the FIGURE of the drawing.

BRIEF DESCRIPTION OF THE FIGURES

The FIGURE schematically shows a plan view of a possible embodiment of an apparatus 100 according to the invention for refurbishing back sides of solar modules. The sequence of an embodiment of the method according to the invention can also be clearly seen via the process steps of the apparatus 100.

DETAILED DESCRIPTION OF THE INVENTION

The apparatus 100 is a system in which a plurality of solar modules, the back side of which has a backing film, can be continuously refurbished on their back sides. The apparatus 100 is typically placed in a workshop, i.e., it is not intended for an on-site refurbishment of solar modules.

The apparatus 100 has process modules arranged successively in a direction of treatment A, which are preferably connected to one another by means of automatic conveying mechanisms.

A process module located at a starting region of the apparatus 100 is a washing device 1. An automatic solar module verification (not shown here) and, if applicable, a solar module anonymization can also be provided upstream of the washing device 1.

The solar modules to be refurbished are washed on or in the washing device 1. In this case, water, with which the solar modules are rinsed off, is used. In the embodiment shown, the solar modules lie, with a front side—that is to say, the side facing the sunlight during use of the solar modules—facing upward, on conveyor rollers 16 which are spaced apart from one another in the direction of treatment A, which transport the solar modules through the washing device 1 one after the other.

In the washing device 1, the solar modules are washed both on their front side, i.e., on their glass side, and on their back side, i.e., on their film side.

Typically, each solar module remains in the washing device 1 shown for approximately 40 to 80 seconds, preferably 60 seconds.

In the exemplary embodiment shown, the washing device 1 has a plurality of roller-shaped high-pressure cleaning strips 17 with brushes and intersecting spray mist nozzles 18.

In the embodiment shown, different brushes are used above and below the solar modules. The lower brushes, that is to say the brushes which are used for the rear-side cleaning of the solar modules, are harder than the upper brushes which serve to clean the glass surface of the solar modules.

The lower brushes are mounted such that they can dip below a frame 11 of the washing device 1.

The water used for washing the solar modules preferably passes through a reverse osmosis unit in a closed water circuit, and is cleaned therein.

In the embodiment shown, a driven roller track 2 with a 90° rotation function for horizontal rotation of the solar modules is arranged in the direction of treatment A after the washing device 1. On the roller track 2, the solar modules continue to lie with their front side facing upward. The roller track 2 can also be omitted.

A drying device 3 then follows in the direction of treatment A.

In the exemplary embodiment shown, the drying device 3 has, directly adjoining the washing device 1, blowers 35 arranged above and below the solar modules. With the blowers 35, compressed air is blown onto the solar modules in order to pre-dry them.

In this pre-dried state, the solar modules enter a paternoster of the drying device 3.

The drying device 3 is partially designed as a paternoster. That is to say, the washed solar modules are taken up into levels of the paternoster in the drying device 3, and conveyed upward and then downward again, without the solar modules having to be turned vertically in this case.

In the embodiment shown, the levels of the paternoster are designed as frame-shaped solar module supports 31, on each of which one solar module is accommodated. In the paternoster, the solar modules lie on the solar module supports 31 with their front sides facing upward.

The paternoster is located in a paternoster cabinet 32. At least one heating element 33 is located in or on the paternoster cabinet 32. In the exemplary embodiment shown, several forced air heaters acting as heating elements 33 are arranged in the paternoster cabinet 32. The at least one heating element generates a temperature in a range from 55 to 60° C. in the paternoster cabinet 32. In this way, evaporation of any residual moisture remaining on the solar modules, in particular on the back sides of the solar modules, can be achieved.

In the embodiment shown, an air dehumidifier 36 is arranged in the paternoster cabinet 32. The air dehumidifier 36 ensures that moisture is removed from the moist, warm air within the paternoster cabinet.

Furthermore, a fan 34 for air circulation within the paternoster cabinet 32 is arranged on the paternoster cabinet 32. Dehumidification inside the paternoster cabinet 32 can be achieved by means of the fan 34.

In addition to its use as a drying device 3, the paternoster or a part thereof can be used as a coating treatment device, which is described in more detail below.

In other embodiments of the present invention which are not shown, an infrared drying device can be provided after the drying device 3 in the direction of treatment A, in which device the solar modules dried by the drying device 3 are finally/thoroughly dried by means of pulsed infrared radiation. However, it has been shown that, using only the drying device 3 designed according to the invention, the solar modules are already so dry that an infrared drying device may be unnecessary.

In the embodiment shown, a driven roller track 4 with a 90° rotation function is arranged after the drying device 3. The roller track 4 can also be omitted in other embodiments of the invention.

A driven turning device 5 in which the solar modules are turned vertically by 180° is arranged downstream of the roller track 4. The front side of the solar modules, i.e., the glass, is then located at the bottom.

Following the turning device 5, in the embodiment shown, there is a driven roller track 6 with flexible width adjustment and stops 61 for orienting the solar modules in a desired fixed orientation.

As is shown schematically using dashed lines, an infrared pretreatment device 7 can be provided after the roller track 6 or between the turning device 5 and the roller track 6. With the infrared pretreatment device 7, the back sides of the solar modules can be heated to a certain temperature before the subsequent rear-side coating. In this case, the infrared pretreatment device 7 is preferably located above a conveying device on which the solar modules are transported.

In a further embodiment, the infrared pretreatment device 7 can also be arranged between the drying device 3 and the turning device 5. In this case, it is preferably located under the conveying device on which the solar modules are transported.

The solar modules then enter a solar module back side coating device 8.

The solar module back side coating device 8 has a robot 9 on which an optical crack recognition device 91, a crack smoothing and/or filling device 92, and a spraying device 93 are provided.

In the embodiment shown, the optical crack recognition device 91 is a camera. If a crack is detected with the optical crack recognition device 91 in the backing film of the solar module, the crack is filled by means of the crack smoothing and/or filling device 92. When all cracks are filled, the entire back side of the solar module is sprayed with a plastic compound, preferably a polymer with an elastomer, by means of the spraying device 93.

If the plastic compound is viscous or pasty, a rolling device for applying the plastic compound to the solar module back side can also be used instead of the spraying device 93.

The plastic compound can be a 1-component or a 2-component plastic compound. The 1-component plastic compound can be designed such that it contains a hardener in a passive form which is activated only after the coating and mixes with a first component of the 1-component plastic compound. The activation of the hardener can take place, for example, with infrared or UV radiation.

If no crack is detected, the coating with the plastic compound takes place immediately with the aid of the spraying device 93. In other embodiments of the invention, the crack recognition device 91 and the crack smoothing and/or filling device 92 can also be omitted.

For the crack smoothing and/or filling and the spray coating of the respective solar module back sides, the respective solar modules rest on a lifting table 81 of the solar module back side coating device 8. A clamping device can be provided on the lifting table 81; a mechanical clamping of the solar module to be coated in each case can be produced automatically by the clamping device.

A suction air curtain 82 is formed on the side of the lifting table 81. The suction air is generated by a vacuum system 10.

In the exemplary embodiment shown, a driven roller track 11 with a lateral 90° displacement is connected to the solar module back side coating device 8. In this case, no rotation and no turning occurs—rather, only a displacement of the solar modules occurs. The back side of the solar module remains facing upward. This is followed by a roller track 12 and a further driven roller track 13 with a lateral 90° displacement.

In other embodiments of the present invention, the roller tracks 11, 12, and 13 can also be omitted.

The following process module is a coating treatment device 14. As indicated above, the coating treatment device 14 can be integrated in the paternoster of the drying device 3. However, it can also be designed as a separate device. The coating treatment device 14 is preferably designed as a paternoster, but does not have to be.

In the coating treatment device 14, the coated solar modules are exposed to infrared radiation. The infrared radiation can be pulsed, but does not have to be.

In other embodiments of the present invention, a different radiation and/or heat can also be used for the treatment of the coated solar modules.

In the coating treatment device 14, a temperature gradient in a range of 35 degrees to 45 degrees, preferably of 40 degrees prevails from its entry to its exit.

In the coating treatment device 14, the coating material which was applied to the respective solar module back sides is dried and polymerized.

The coating treatment device 14 is followed by a roller track 15 for removing the finished refurbished solar modules.

A turning device can also be connected to the roller track 15.

The refurbished solar modules subsequently undergo an optical inspection and a performance verification, such as a flash test.

The invention claimed is:

1. An apparatus for refurbishing back sides of solar modules, the apparatus comprising:

successively in a direction of treatment, a washing device, a drying device, a solar module back side coating device, and a coating treatment device;

said drying device being formed, at least in part, as a paternoster.

2. The apparatus according to claim 1, wherein said washing device has washing elements and washing nozzles arranged above and below a solar module conveyor track.

3. The apparatus according to claim 1, wherein said washing device has a closed water circuit.

4. The apparatus according to claim 1, wherein said paternoster comprises frame-shaped solar module supports.

5. The apparatus according to claim 1, wherein said paternoster is arranged in a paternoster cabinet and wherein at least one heating element is arranged in or on said paternoster cabinet.

6. The apparatus according to claim 5, which comprises at least one air dehumidifier arranged in said paternoster cabinet.

7. The apparatus according to claim 1, which comprises a solar module turning device arranged between said drying device and said solar module back side coating device in the direction of treatment.

8. The apparatus according to claim 7, which comprises an infrared pretreatment device arranged between said solar module turning device and said solar module back side coating device.

9. The apparatus according to claim 1, wherein said solar module back side coating device has an optical crack recognition device, a crack smoothing and/or filling device, and a spraying or rolling device.

10. The apparatus according to claim 1, which comprises a suction air curtain formed on a side of said solar module back side coating device.

11. The apparatus according to claim 1, wherein said coating treatment device is formed as a paternoster.

12. The apparatus according to claim 1, wherein said drying device includes a vacuum chamber, and/or a vacuum chamber is arranged after said coating treatment device in the direction of treatment.

13. The apparatus according to claim 1, which comprises a solar module front-side nano-coating device arranged after said coating treatment device in the direction of treatment.

14. A method for refurbishing back sides of solar modules, the method comprising:

washing the solar modules;

subsequently drying the solar modules, thereby at least partially drying the washed solar modules in a paternoster while moving the solar modules up and down while horizontal;

subsequently coating the back sides of the solar modules with a coating in a coating process; and subsequently drying and polymerizing the coating applied on the back sides of the solar modules.

15. The method according to claim 14, which comprises simultaneously washing the solar modules on both sides.

16. The method according to claim 14, which comprises using water for washing the solar modules and conveying the water in a closed water circuit.

17. The method according to claim 14, wherein the paternoster is located in a heated paternoster cabinet.

18. The method according to claim 17, which comprises dehumidifying the paternoster cabinet.

19. The method according to claim 14, which comprises turning the horizontal solar modules after the drying and before the coating of the solar modules, with their back sides pointing upward after the turning.

20. The method according to claim 19, which comprises heating at least the back sides of the solar modules and/or thoroughly drying by infrared radiation after the turning and before the coating.

21. The method according to claim 14, which comprises, after drying and prior to coating the solar modules, examining the back sides of the solar modules for cracks with an optical crack recognition device.

22. The method according to claim 21, which comprises smoothing the cracks detected by the crack recognition device by a crack smoothing and/or filling device.

23. The method according to claim 14, wherein the coating step comprises spraying or roll coating the back sides of the solar modules in the coating process, with air being suctioned off by way of an air suction curtain arranged on a side of a conveying device on which the solar modules lie during the spraying or roll coating.

24. The method according to claim 14, which comprises moving the coated solar modules up and down in a paternoster while lying horizontal during the steps of drying and polymerizing the coating.

25. The method according to claim 14, which comprises performing at least one of drying the solar modules, drying the coating, or polymerizing the coating in a vacuum.

26. The method according to claim 14, which comprises, after the coating on the solar module back side has been dried and polymerized, applying a nano-coating to the solar module front side.

27. The method according to claim 14, which comprises using a coating material for the coating which is hydrophilic and absorbs water prior to drying and polymerizing.

* * * * *